United States Patent
Han

(10) Patent No.: US 7,632,730 B2
(45) Date of Patent: Dec. 15, 2009

(54) CMOS IMAGE SENSOR AND METHOD FOR MANUFACTURING THE SAME

(75) Inventor: Chang Hun Han, Icheon-si (KR)

(73) Assignee: Dongbu Electonrics Co., Ltd., Seoul (KR)

( * ) Notice: Subject to any disclaimer, the term of this patent is extended or adjusted under 35 U.S.C. 154(b) by 0 days.

(21) Appl. No.: 12/105,493

(22) Filed: Apr. 18, 2008

(65) Prior Publication Data

US 2008/0227248 A1 Sep. 18, 2008

Related U.S. Application Data

(62) Division of application No. 10/747,307, filed on Dec. 30, 2003, now Pat. No. 7,411,234.

(30) Foreign Application Priority Data

Sep. 23, 2003 (KR) .................. 10-2003-0065879

(51) Int. Cl.
*H01L 21/8238* (2006.01)

(52) U.S. Cl. .................. 438/199; 438/197; 438/510; 257/E21.58; 257/E21.422; 257/E21.545; 257/E21.562; 257/E21.632

(58) Field of Classification Search .................. 438/197, 438/199, 506, 510, 524, 637
See application file for complete search history.

(56) References Cited

U.S. PATENT DOCUMENTS

| 6,380,568 | B1 | 4/2002 | Lee et al. |
| 6,462,365 | B1 | 10/2002 | He et al. |
| 6,486,521 | B2 | 11/2002 | Zhao et al. |
| 6,838,714 | B2 | 1/2005 | Rhodes et al. |
| 6,855,595 | B2 | 2/2005 | Han et al. |
| 7,411,234 | B2 * | 8/2008 | Han .......................... 257/292 |
| 2003/0127666 | A1 | 7/2003 | Lee |
| 2005/0062078 | A1 | 3/2005 | Han |
| 2005/0064620 | A1 | 3/2005 | Han |

FOREIGN PATENT DOCUMENTS

| JP | 10-098176 | 4/1998 |
| KR | 2003-42303 | 5/2003 |
| KR | 2003-42308 | 5/2003 |

OTHER PUBLICATIONS

Office Action from the Korean Intellectual Property Office, dated Aug. 16, 2005, in counterpart Korean Patent Application No. 10-2003-0065879.

* cited by examiner

*Primary Examiner*—David Nhu
(74) *Attorney, Agent, or Firm*—Finnegan, Henderson, Farabow, Garrett & Dunner, L.L.P.

(57) ABSTRACT

A CMOS image sensor and a manufacturing method are disclosed. The gates of the transistors are formed in the active region of the unit pixel, and a diffusion region for the photo diode is defined by an ion implantation of impurities to the semiconductor substrate. The patterns of the photoresist that are the masking layer against ion implantation are formed on the semiconductor substrate in such a manner that they have the boundary portion of the isolation layer so as not to make the boundary of the defined photo diode contact with the boundary of the isolation layer. Damages by an ion implantation of impurities at the boundary portion between the diffusion region for the photo diode and the isolation layer are prevented, which reduces dark current of the COMS image sensor.

4 Claims, 9 Drawing Sheets

Prior Art

Prior Art

Prior Art

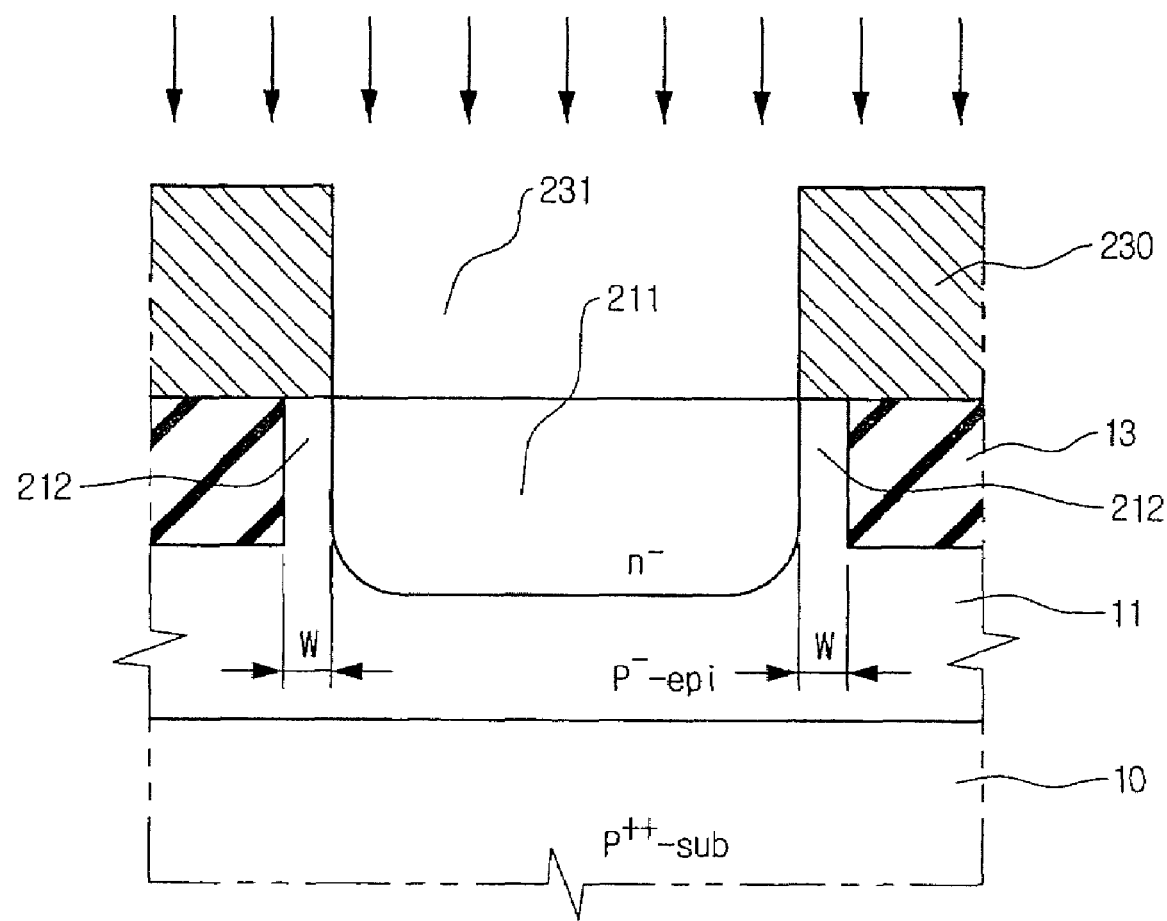

US 7,632,730 B2

CMOS IMAGE SENSOR AND METHOD FOR MANUFACTURING THE SAME

This application is a division of U.S. patent application Ser. No. 10/747,307, filed Dec. 30, 2003, now U.S. Pat. No. 7,411,234, which is based on and claims the priority to Korean Patent Application No. 10-2003-0065879, filed on Sep. 23, 2003. The entire contents of these applications are incorporated herein by reference in their entirety.

BACKGROUND OF THE INVENTION

1. Field of the Invention

The present invention relates to a CMOS image sensor, and more particularly to a CMOS image sensor and method for manufacturing the same, in which a diffusion region of a photo diode is disposed apart from an isolation layer, and thereby a dark current may be reduced.

2. Description of the Related Art

In general, an image sensor is a semiconductor device for converting an optical image into an electrical signal, and is generally classified into either a charge coupled device (CCD) or a complementary MOS (CMOS) image sensor.

The CCD is a device constructed in such a manner that each MOS capacitor is adjacently disposed to each other, and that charge carriers are stored on any one of the MOS capacitors and then transferred to another MOS capacitor next to the MOS capacitor stored by the charge carrier. The CCD has various disadvantages, such as complicated drive mode, much power consumption, complicated manufacturing process derived from many photo processes and so forth. Additionally, the CCD has a disadvantage in that it is difficult to make a product compact, due to difficulty in integrating various circuits such as a controlling circuit, a signal processing circuit, analog/digital converting circuit, etc., into a chip for the CCD.

Currently, as a next generation image sensor for overcoming the disadvantages of the CCD, attention is focused on CMOS image sensors. The CMOS image sensor is a device employing a switching mode of forming MOS transistors as many as the number of unit pixels on a semiconductor substrate using CMOS technology for a controlling circuit, a signal processing circuit, etc as a periphery circuit, and sequentially detecting outputs of each unit pixel by means of the MOS transistors. That is, the CMOS image sensor sequentially detects electrical signals of each unit pixel in a switching mode to realize an image through formation of a photo diode and a MOS transistor within a unit pixel.

The CMOS image sensor has advantages such as low power consumption, simple manufacturing process resulting from decreased photo processes, etc., because it makes use of such CMOS manufacturing technology. In addition, the CMOS image sensor has an advantage in that it is easier to make a product compact by integration of a controlling circuit, a signal processing circuit, an analog/digital converting circuit, etc. into a chip for the CMOS image sensor. For this reason, the CMOS image sensor is presently broadly used in various applications, such as digital still cameras, digital video cameras and so forth.

FIG. 1 shows a circuit for a unit pixel of a general CMOS image sensor. As shown in FIG. 1, the unit pixel 100 of the CMOS image sensor includes a photo diode 110 as a photoelectric transformation section and four transistors. The four transistors may include a transfer transistor 120, a reset transistor 130, a drive transistor 140 and a select transistor 150. An output terminal OUT of the unit pixel 100 may be connected with a load transistor 160. Herein, reference FD may be a floating diffusion region, reference Tx may be a gate voltage of the transfer transistor 120, reference Rx may be a gate voltage of the reset transistor 130, reference Dx may be a gate voltage of the drive transistor 140, and a reference Sx may be a gate voltage of the select transistor 150.

FIG. 2 shows a layout of a unit pixel of the conventional CMOS image sensor. As shown in FIG. 2, in a unit pixel 100, an active region may be a region defined by a bold solid line and an isolation region may be a region outside the active region in which an isolation layer (not shown) may be formed. The gates 123, 133, 143 and 153, respectively of the transfer transistor 120, reset transistor 130, drive transistor 140 and select transistor 150 may be disposed as to be across an upper portion of the active region. Also, a region indicated by a dotted line may be a region which is exposed in an opening of a photoresist (not shown) as a masking layer against ion implantation upon the ion implantation process for forming a diffusion region of the photo diode and which may be defined wider than an active region of the photo. diode PD. The reference FD may be a floating diffusion region.

FIG. 3 is a structural cross-sectional view showing the photo diode portion of the unit pixel taken along a line A-A of FIG. 2. As shown in FIG. 3, a $P^-$ type epitaxial layer 11 may be formed on a $P^{++}$ type semiconductor substrate 10. To define an active region of the semiconductor substrate 10, an isolation layer 13 may be formed on a portion of the epitaxial layer 11 for an isolation region of the semiconductor substrate 10. An $n^-$ type diffusion region 111 and a $P^0$ type diffusion region 113 of the photo diode PD may be formed on a portion of the epitaxial layer 11 for a photo diode region of the active region, the $P^0$ type diffusion region 113 being positioned on the $n^-$ type diffusion region 111.

The conventional CMOS image sensor 100 with such construction typically has a defect such as degradations of a performance of the device and an electric charge storing capacity, due to an increase of dark current.

Dark current may be generated by electrons transferred to the floating diffusion region from the photo diode in a state that lights are not yet incident to the photo diode. It has been reported that dark current has been caused generally from various kinds of defects, such as a dangling bond and so forth disposed on a neighboring portion adjacent to the surface of the semiconductor substrate, a boundary portion of the isolation layer and the $P^0$ type diffusion region, a boundary portion of the isolation layer and the $n^-$ type diffusion region, a boundary portion of the $P^0$ type diffusion region and the $n^-$ type diffusion region, the $P^0$ type diffusion region and the $n^-$ type diffusion region. Dark current may cause considerable problems such as degradations of a performance and an electric charge storing capacity in the CMOS image sensor under a circumstance of low illumination.

Accordingly, the conventional CMOS image sensor has used both the $P^0$ type diffusion region and the $n^-$ type diffusion region for the photo diode in order to reduce dark current generated especially from the neighboring portion adjacent to the surface of a silicon substrate.

However, the conventional CMOS image sensor has been greatly affected by dark current generated at the boundary portions of the isolation region and the $P^0$ type diffusion region, and the $P^0$ type diffusion region the $n^-$ type diffusion region.

More particularly, as shown in FIG. 3, when patterns (not shown) of a photoresist as a mask layer against an ion implantation for forming the $n^-$ type diffusion region 111 and the $P^0$ type diffusion region 113 of the photo diode PD may be formed on the semiconductor substrate 10, the whole active region for the photo diode PD is exposed in an opening of the photoresist patterns. In such state, when impurities for the n⁻ type diffusion region 111 and the P⁰ type diffusion region 113 are ion-implanted in the active region of the photo diode PD, the impurities for the n⁻ type diffusion region 111 and the P⁰ type diffusion region 113 are also ion-implanted to the boundary portion between the active region and the isolation layer 13 of the photo diode PD.

Thus, damages by the ion implantation of impurities may be caused at the boundary portion between the n⁻/P⁰ type diffusion regions 111 and 113 and the isolation layer 13, further generating defects. The defects may cause a generation of electric charge or hole carriers, and also provide places for re-binding of the electric charges and the halls. Consequently, leakage current of the photo diode and therefore dark current of the CMOS image sensor are increased.

As described above, the conventional CMOS image sensor may have a construction in which impurities for forming the diffusion region of the photo diode are also ion-implanted on the boundary portion between the isolation layer and the active region for the photo diode when the impurities are ion-implanted for forming the diffusion region of the photo diode. Thus, the conventional CMOS image sensor may have a limit in increasing characteristics of the device because it may be difficult to restrict dark current generated at the boundary portion between the isolation layer and the active region for the photo diode, and to maintain device characteristics between the pixels constant.

Meanwhile, Korean Laid-Open Patent Publication Nos. 2003-42303 and 2003-42308 disclose a method for reducing dark current of CMOS image sensor by performing an ion implantation of impurities to an active region for a photo diode, which, however, do not present a solution to restrict an increase of dark current by preventing impurities from being ion-implanted to the boundary portion between an isolation layer and an active region for a photo diode.

Also, U.S. Pat. Nos. 6,486,521 and 6,462,365, assigned on their face to Omnivision Technologies Inc., entitled "Active Pixel having Reduced Dark Current in a CMOS Image Sensor," disclose a method for restricting an increase of dark current due to a dangling bond at the surface of a photo diode, in which a transparent insulating layer such as an oxide layer is formed on the surface of the photo diode as a passivation layer. However, the methods do not also present a solution to restrict an increase of dark current by preventing impurities from being ion-implanted to the boundary portion between the isolation layer and the active region for the photo diode.

SUMMARY OF THE INVENTION

Accordingly, embodiments consistent with the present invention has been made to solve the above-mentioned problem occurring in the prior art, and an aspect of an embodiment of the present invention is to improve device characteristics of CMOS image sensor by preventing impurities from being ion-implanted to the boundary portion between an isolation layer and an active region for a photo diode, thus reducing dark current.

Another aspect of an embodiment of the present invention is to improve device characteristics of CMOS image sensor by maintaining device characteristics between pixels constant.

In order to accomplish these aspects, a CMOS image sensor is provided comprising a semiconductor substrate having an isolation region and an active region for a unit pixel; a transistor formed on said semiconductor substrate; and an impurity diffusion region for a photo diode formed in a portion of the active region and separated from the isolation region by a certain distance.

The semiconductor substrate may be a P⁺⁺ type silicon substrate having a P⁻ type epitaxial layer, and the diffusion region for the photo diode has an n⁻ type diffusion region.

A P⁰ type diffusion region may be formed on the n⁻ type diffusion region of the photo diode so as to reduce dark current generated on the surface of the semiconductor substrate.

According to another aspect of consistent with embodiments of the present invention, a method for manufacturing a CMOS image sensor is provided which comprises forming an isolation layer and an active region for a unit pixel on a semiconductor substrate; forming a transistor on said semiconductor substrate; forming a masking layer against an ion implantation on the isolation layer and on a portion of the active region on the boundary between the isolation layer and the active region; and performing an ion implantation of impurities for forming a diffusion region for said photo diode in a portion of the active region.

The masking layer against ion implantation may be formed with a photoresist.

The semiconductor substrate may be a P⁺⁺ type silicon substrate having a P⁻ type epitaxial layer, and the diffusion region for the photo diode may have an n⁻ type diffusion region.

P⁰ type diffusion region may be formed on the n⁻ type diffusion region of the photo diode so as to reduce dark current generated on the surface of the semiconductor substrate.

Accordingly, since the diffusion region for the photo diode is spaced apart from the isolation layer, damages by an ion implantation of impurities to the boundary portion between the isolation layer and the diffusion region for the photo diode are prevented, which restricts an increase of dark current of the CMOS image sensor.

BRIEF DESCRIPTION OF THE DRAWINGS

The above and other aspects, features and advantages of the embodiments consistent with the present invention will be more apparent from the following detailed description taken in conjunction with the accompanying drawings, in which:

FIGS. 7A to 7E are process views showing a method for manufacturing a CMOS image sensor consistent with embodiments of the present invention.

DETAILED DESCRIPTION OF THE EMBODIMENTS

Figure 1:
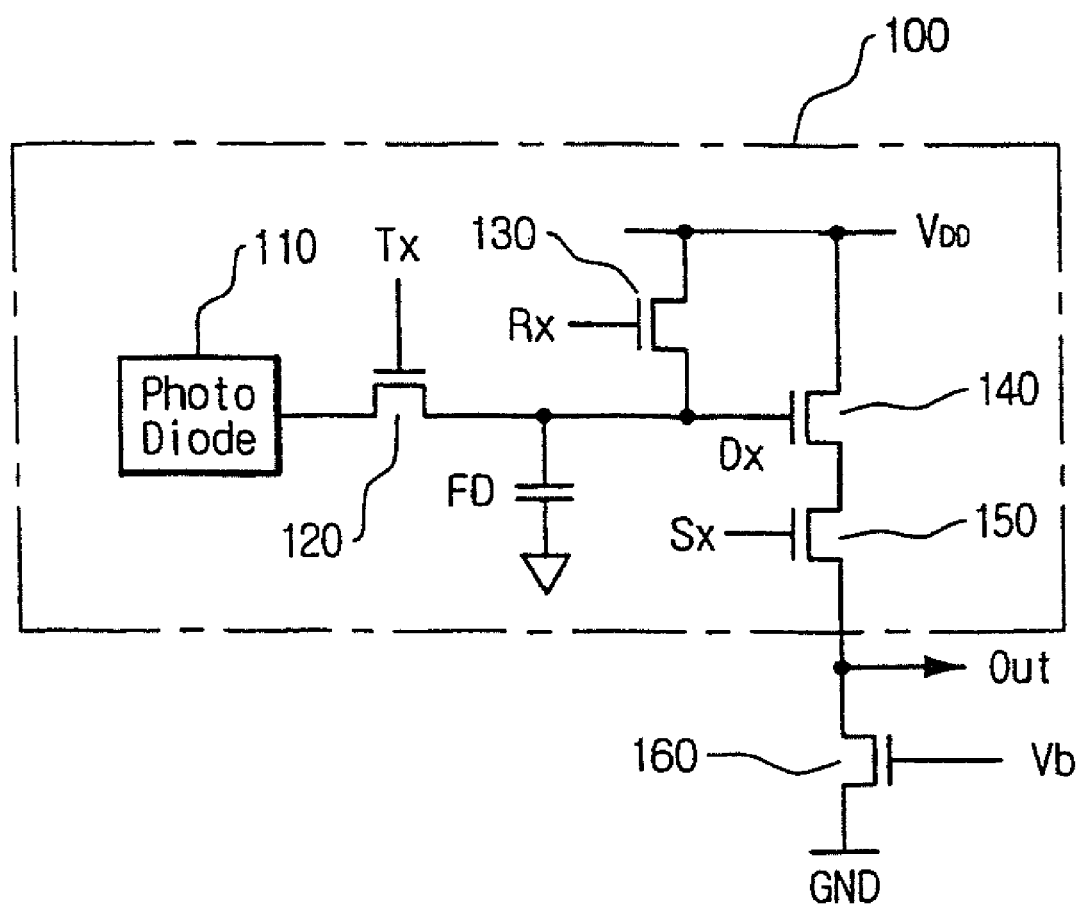
FIG. 1 shows a circuit for a unit pixel of a general CMOS image sensor.
Figure 2:
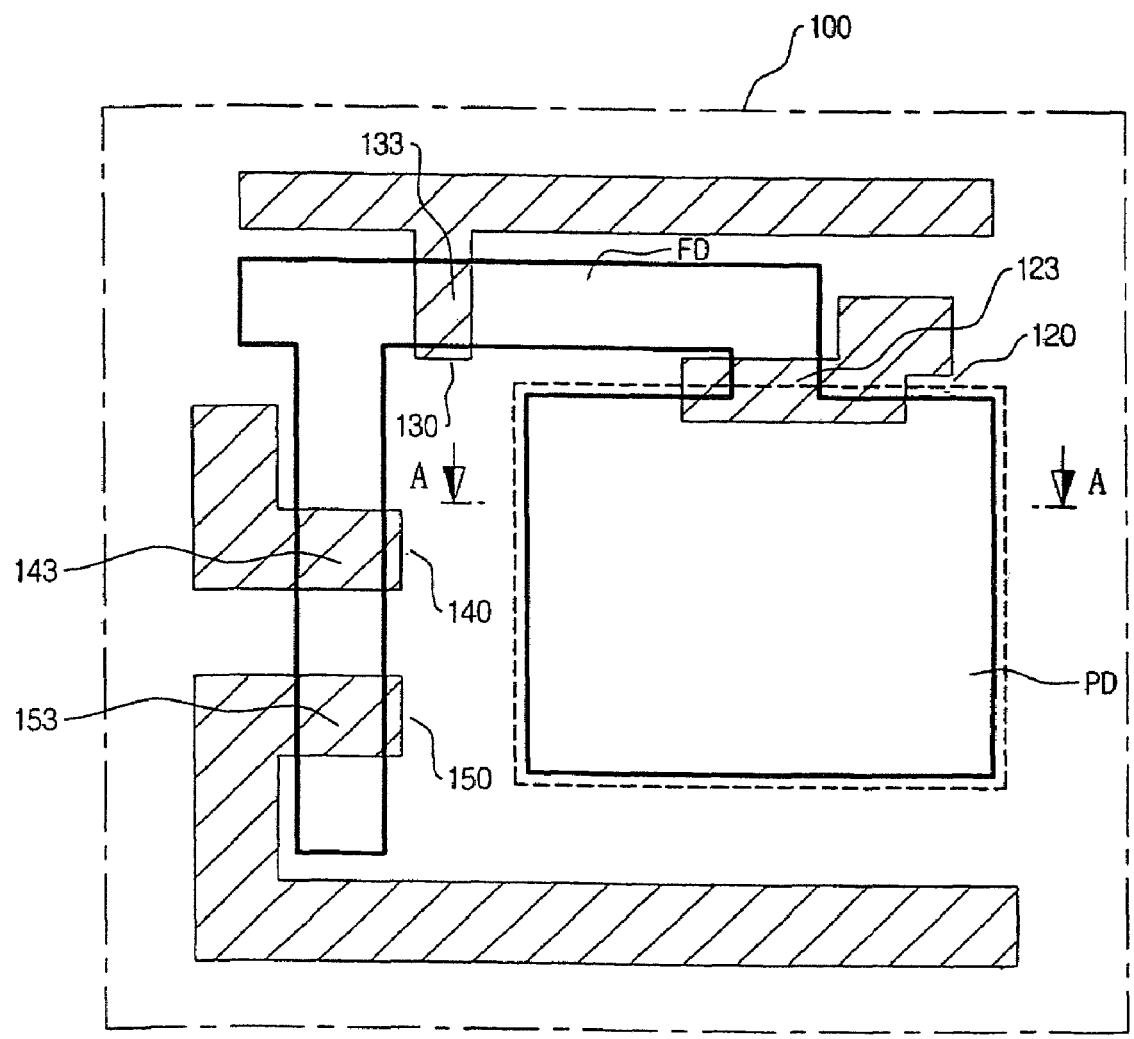
FIG. 2 shows a layout of a unit pixel of the conventional CMOS image sensor.
Figure 3:
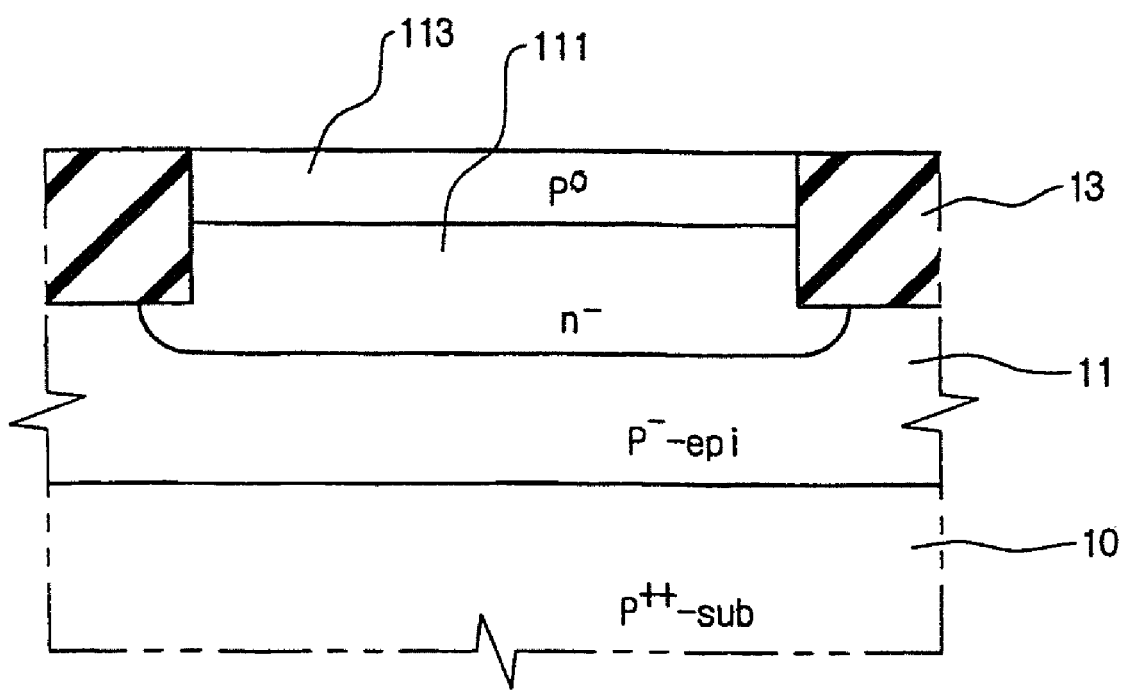
FIG. 3 is a structural cross-sectional view showing a portion of a photo diode of a unit pixel taken along a line A-A of FIG. 2.

Hereinafter, embodiments of the present invention will be described with reference to the accompanying drawings. In the following description and drawings, the same reference numerals are used to designate the same or similar components, and so repetition of the description of the same or similar components will be omitted.

Figure 4:
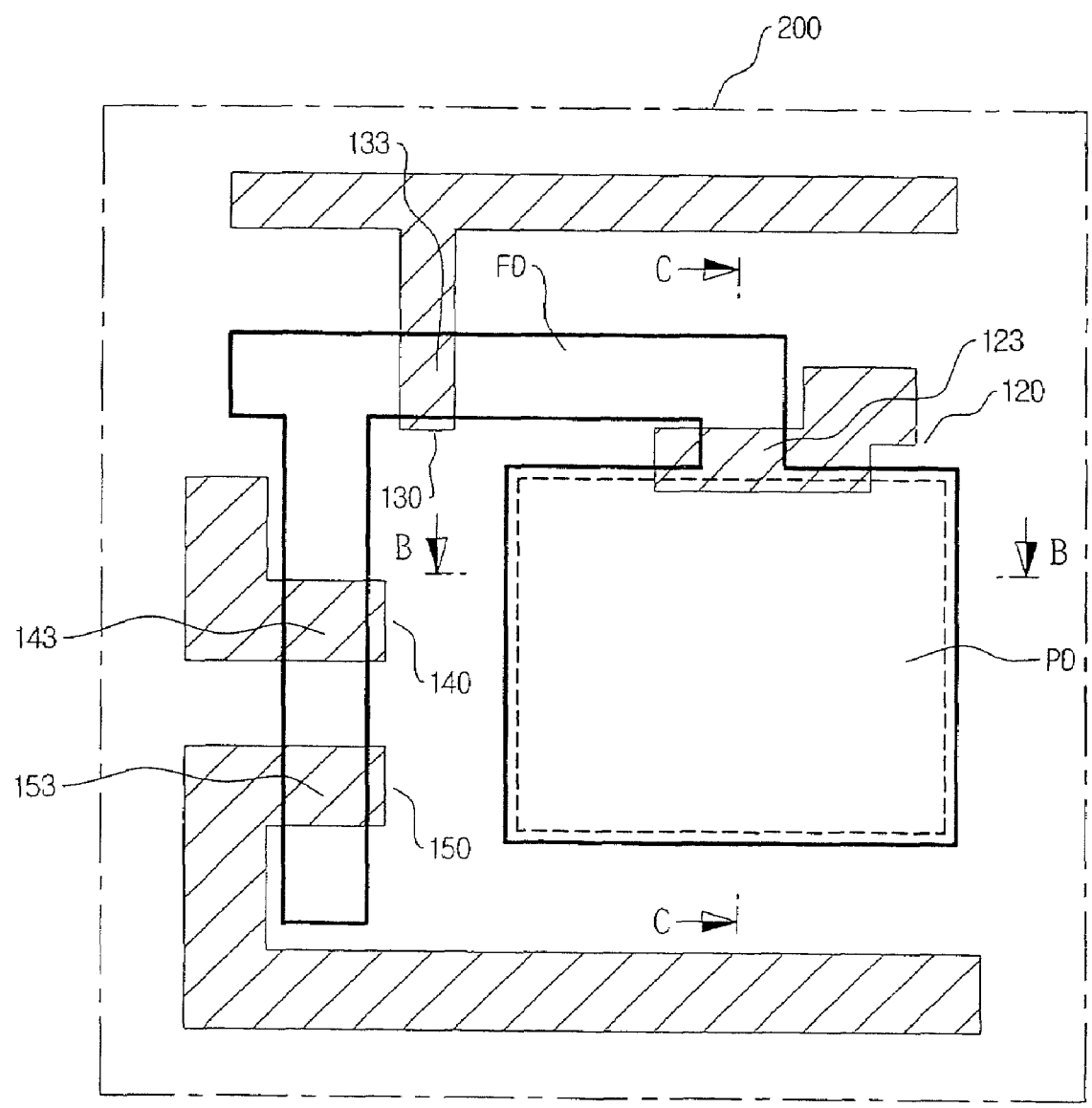
FIG. 4 is a layout of a unit pixel of a CMOS image sensor consistent with the present invention.

FIG. 4 is a layout of a unit pixel of a CMOS image sensor of embodiments consistent with the present invention.

Referring to FIG. 4, in a unit pixel 200 of a CMOS image sensor of embodiments consistent with the present invention, an active region may be a region defined by a bold solid line and an isolation region may be a region outside the active region in which an isolation layer (not shown) may be formed. The gates 123, 133, 143 and 153, respectively, of the transfer transistor 120, reset transistor 130, drive transistor 140 and select transistor 150 may be disposed as to be across an upper portion of the active region. Also, a region indicated by a dotted line may be a region which is exposed in an opening of a photoresist (not shown) as a masking layer against ion implantation upon the ion implantation process for forming a diffusion region of the photo diode and which may be defined narrower than the active region of the photo diode PD. The reference FD represents a floating diffusion region.

Meanwhile, although the unit pixel 200 of the present embodiment is illustrated to have one photo diode and four transistors, in fact, it may have one photo diode and three transistors, i.e., a reset transistor, a driver transistor and a select transistor. For convenience of explanation, the present embodiment will be described with reference to a unit pixel having a structure of one photo diode and four transistors.

Figure 5:
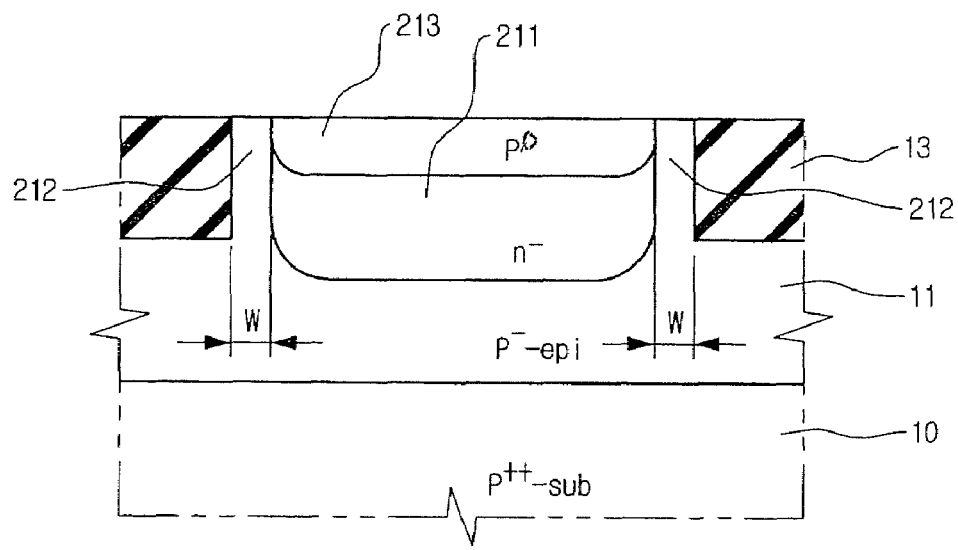
FIG. 5 is a structural cross-sectional view showing a portion of a photo diode of a unit pixel taken along a line B-B of FIG. 4.
Figure 6:
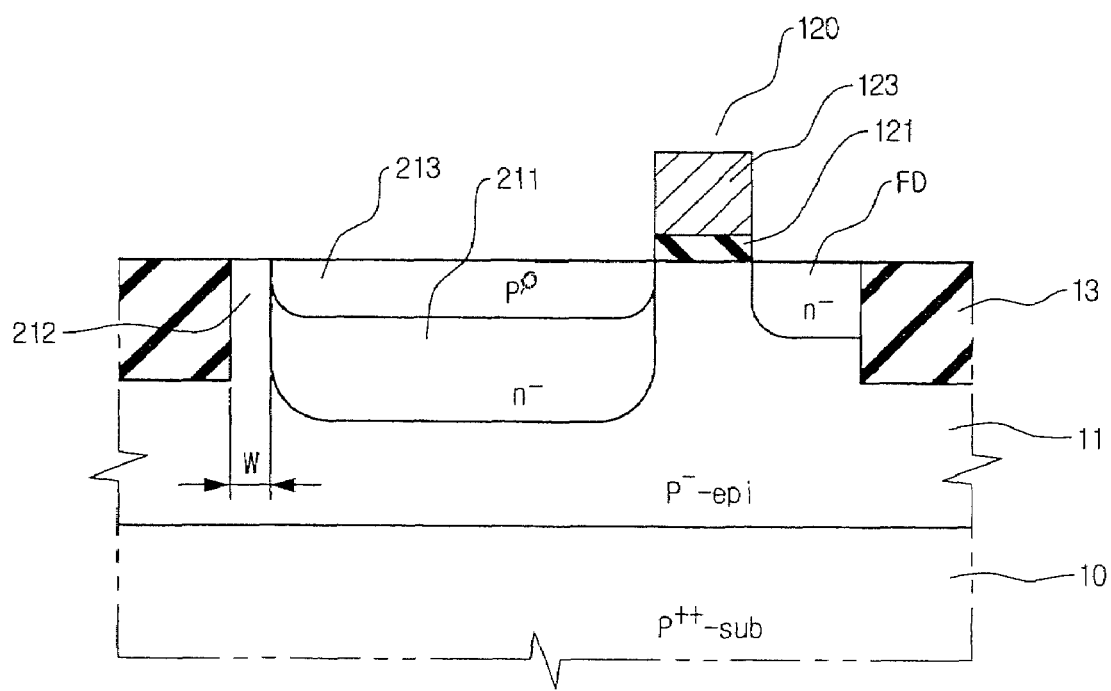
FIG. 6 is a structural cross-sectional view showing a portion of a photo diode of a unit pixel and a transfer gate taken along a line C-C of FIG. 4.

FIG. 5 is a structural cross-sectional view showing a portion of a photo diode of a unit pixel taken along a line B-B of FIG. 4, and FIG. 6 is a structural cross-sectional view showing a portion of a photo diode of a unit pixel and a transfer gate taken along a line C-C of FIG. 4, which drawings are now described in conjunction with each other.

Referring to FIGS. 5 and 6, a P⁻ type epitaxial layer 11 may be formed on a P⁺⁺ type semiconductor substrate 10. The semiconductor substrate may employ, for example, a single crystal silicon substrate. To define an active region of the semiconductor substrate 10, an isolation layer 13 may be formed on a portion of the epitaxial layer 11 for an isolation region of the semiconductor substrate 10. Although the isolation layer 13 is illustrated to be formed by a shallow trench isolation (STI) process, it may be formed by a local oxidation of silicon (LOCOS) process, etc. A gate insulating layer 121 and a gate 123 of a transfer transistor 120 are formed on a portion of the epitaxial layer 11 for the transfer transistor 120.

Also, an n⁻ type diffusion region 211 and a P° type diffusion region 213 for photo diode PD may be formed in the epitaxial layer 11 in such a manner that they may be spaced apart by a distance W from the isolation layer 13 with an edge portion 212 of the active region disposed therebetween. The epitaxial layer 11 of the edge portion 212 may be a region in which impurities for forming the n⁻ type diffusion region 211 and the P° type diffusion region 213 may not be diffused.

Also, the floating diffusion region FD may be formed in the epitaxial layer 11 in such a manner that it may be spaced apart from the n⁻/P° type diffusion regions 211 and 213 with the gate 123 of the transfer transistor 120 disposed therebetween.

Meanwhile, although the photo diode PD is illustrated to have the n⁻/P° type diffusion regions 211 and 213, in fact, it may have the n⁻ type diffusion region 211 only. The P⁺⁺ type means a high concentration P type, the P° type means a middle concentration P type, and the n⁻ type means a low concentration n type. The first and second conductive types, respectively may be P type and n type, respectively, or n type and P type, respectively. The embodiments consistent with the present invention will be now described with reference to a photo diode having P°/n⁻ type diffusion region.

In the CMOS image sensor of the present embodiment having a construction described above, an n⁻ type diffusion region 211 and a P° type diffusion region 213 for photo diode PD may be formed in such a manner that they are spaced apart by a distance W of, for example, above 300 μm from the isolation layer 13.

Thus, an increase of leakage current generated to the boundary portions between the isolation layer 13 and the n⁻ type diffusion region 211 and between the isolation layer 13 and the P° type diffusion region 213 can be reduced. This may also reduce dark current and maintain device characteristics between the unit pixels consistent with the result that dark current characteristics, electric charge storing capacity, and device characteristics, of the CMOS image sensor may be improved.

A method for manufacturing CMOS image sensor of embodiments of the present invention will be now described with reference to FIGS. 7A to 7E. For convenience of explanation, the method of consistent with embodiments of the present invention is described based upon a sectional structure of a unit pixel of FIG. 5.

Figure 7A:
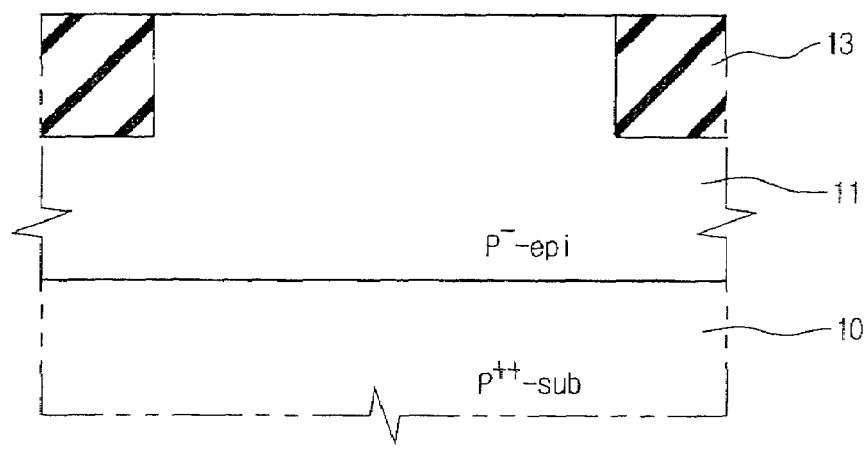

Referring to FIG. 7A, a semiconductor substrate 10 is provided. The semiconductor substrate may employ a high concentration and first conductive type, for example, P⁺⁺ type, single crystal silicon substrate. On one surface of the semiconductor substrate 10, for example, a surface on which a device is formed, a low concentration and first conductive type, for example, P⁻ type, epitaxial layer 11 may be grown and formed by an epitaxial process so as to form a depletion region larger and deeper in a photo diode, thereby increasing performance of low voltage photo diode for collecting photocharge and thus improving photosensitivity.

Then, as shown in FIG. 4, to define an active region for a transfer transistor 120, a reset transistor 130, a drive transistor 140 and a select transistor 150 together with an active region of the photo diode PD, an isolation layer 13 may be formed on a portion of an epitaxial layer 11 for an isolation region of the semiconductor substrate 10 by STI process. Of course, the isolation layer 13 may be formed by LOCOS process.

Then, a gate insulating layer for the transfer transistor 120, the reset transistor 130, the drive transistor 140 and the select transistor 150 of FIG. 4 may be formed in a desired thickness on the epitaxial layer 11 in whole area of the active region including the active region of the photo diode PD. Herein, the gate insulating layer may be formed with, for example, a thermal oxide layer grown by a thermal oxidation process.

Then, a conductive layer, for example, a high concentration poly crystal silicon layer for gates 123, 133, 143 and 153 of the transfer transistor 120, the reset transistor 130, the drive transistor 140 and the select transistor 150 may be formed in a desired thickness on the gate insulating layer. Of course, as is not shown in the drawing, the conductive layer for the gates may be formed with a high concentration poly crystal silicon layer and a silicide layer thereon.

Then, using a photolithography employing a photo mask (not shown) on which patterns for the gates 123, 133, 143 and 153, the conductive layer and the gate insulating layer may be etched in such a manner that portions thereof corresponding the patterns are left and the rest of the portions is removed.

That is, the conductive layer and the gate insulating layer only on the portions for the gates 123, 133, 143 and 153 may be left and the rest of the portions is removed so as to form the gates 123, 133, 143 and 153. Herein, as shown in FIG. 6, the transfer transistor 120 may have a laminating structure of the gate insulating layer 213 and the gate 123. Of course, as are not shown in the drawing, the reset transistor 130, the drive transistor 140 and the select transistor 150 also may have the same laminating structure as that of the transfer transistor 120.

Figure 7B:
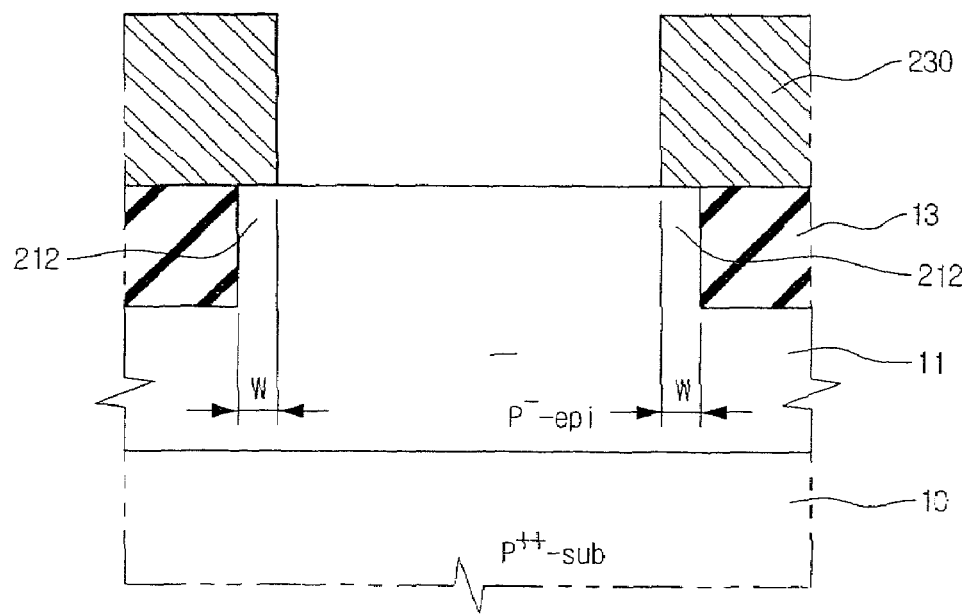

Referring to FIG. 7B, a masking layer against an ion implantation, for example, patterns 230 of a photoresist may be formed on the semiconductor substrate. Herein, the patterns 230 of the photoresist may have an opening 231 exposing a narrower region than the whole area of the active region of the photo diode PD. Thus, since the patterns 230 of the photoresist can mask the edge portion 212 of the active region, the epitaxial layer 11 of the active region for the n⁻ type diffusion region 211 of FIG. 7C may be substantially exposed in the opening 231.

Preferably, the patterns 230 of the photoresist may be formed in such a manner that they extend some distance W, for example above 300 μm, from the isolation layer 13 toward a center portion of the active region of the photo diode PD. This may prevent the n⁻ type diffusion region 211 from being in contact with the isolation layer 13 when the n⁻ type diffusion region 211 is diffused on a subsequent annealing process.

Accordingly, the present embodiment can provide a CMOS image sensor by modifying the photo mask for forming the existing photo diode into a new photo mask for forming the patterns 230 of the photoresist having the opening 231, by which the manufacturing processes are simplified and characteristics of dark current are excellent because the present embodiment utilizes the existing manufacturing processes without adding a separate process to the existing manufacturing processes or modifying the same.

Referring to FIG. 7C, using the patterns 230 of the photoresist as a masking layer against ion implantation, a second conductive, for example, n type, impurities may be ion-implanted with low concentration and high energy to the exposed epitaxial layer 11, thus forming the n⁻ type diffusion region 211. Herein, the n⁻ type diffusion region 211 and isolation layer 13 may be spaced apart relative to each other by a distance W with the edge portion 212 disposed therebetween.

Accordingly, the present embodiment may prevent the boundary portion between the isolation layer 13 and the n⁻ type diffusion region 211 from being damaged by an ion implantation of impurities and also defects due to the damages. This may restrict an increase of dark current of the CMOS image sensor.

Figure 7D:
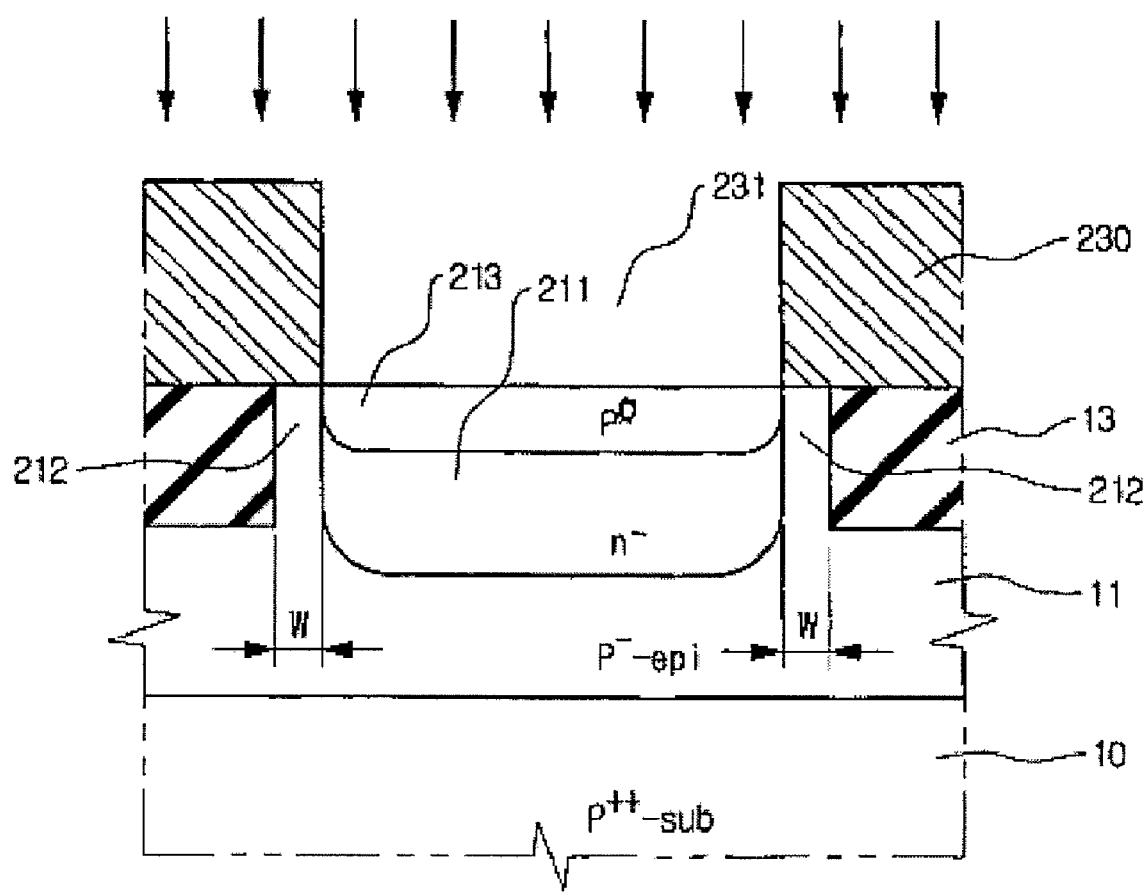

Referring to FIG. 7D, re-using the patterns 230 of the photoresist of FIG. 7C as a mask layer against ion implantation, P type impurities may be ion-implanted with a middle concentration and low energy to the n⁻ type diffusion region 211, forming the P° type diffusion region 213 of the photo diode on the n⁻ type diffusion region 211. Herein, P° type diffusion region 213 and the isolation layer 13 may be disposed spaced apart to each other by a distance W with the edge portion 212 disposed therebetween.

Accordingly, the present embodiment prevents the boundary portion between the isolation layer 13 and the P° type diffusion region 213 from being damaged by an ion implantation of impurities and also defects due to the damages. This may restrict an increase of dark current of the CMOS image sensor.

Meanwhile, it is evident that, by omitting the ion implantation for forming the P° type diffusion region 213, the photo diode having only n⁻ type diffusion region 211 may be formed.

Figure 7E:
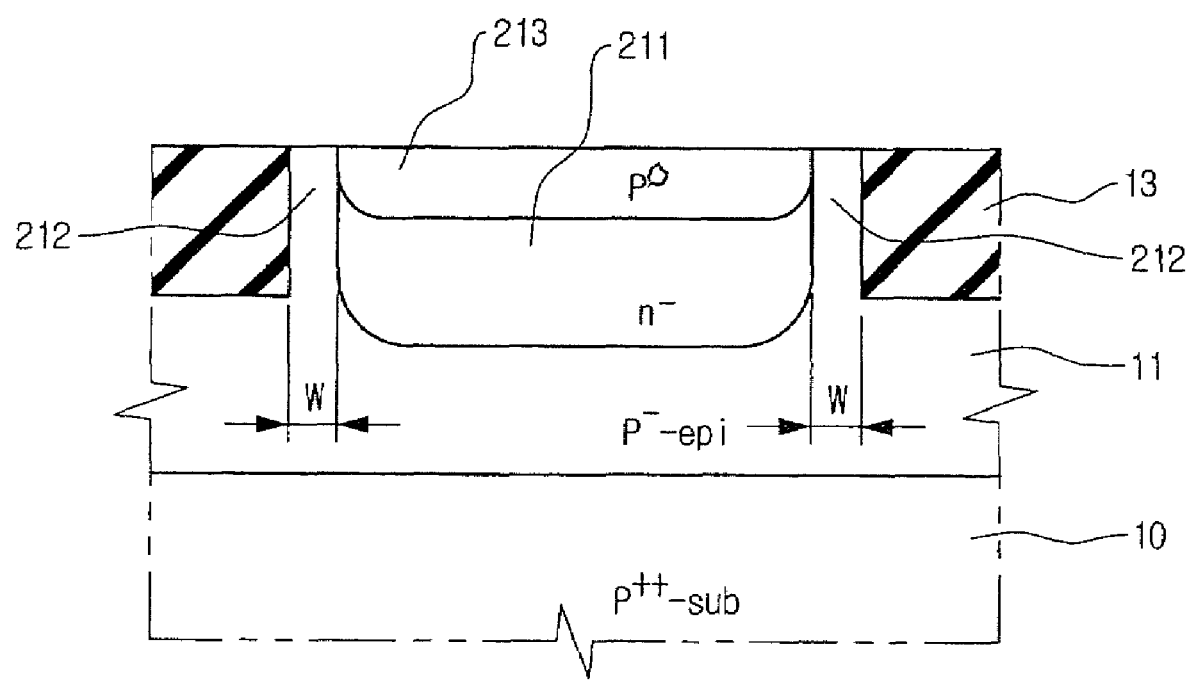

Referring to FIG. 7E, after removing the patterns 230 of the photoresist of FIG. 7D, impurities ion-implanted to the n⁻ type diffusion region 211 and the P° type diffusion region 213 may be diffused through an annealing process, substantially forming a junction between the n⁻ type diffusion region 211 and the P° type diffusion region 213.

Herein, since the n type diffusion region 211 and the P° type diffusion region 213 may be spaced apart from the isolation layer 13 by a distance W, the n⁻ type diffusion region 211 and the P° type diffusion region 213 may not be in contact with the isolation layer 13, which may prevent an increase of leakage current generated on the boundary portion of the isolation layer 13, and of dark current.

Then, as is not shown in the drawings, using the existing manufacturing processes, the floating diffusion region FD and the source/drain diffusion region of the transfer transistor 120, the reset transistor 130, the drive transistor 140 and the select transistor 150 in FIG. 4 may be formed so that the manufacturing process for the unit pixel of the CMOS image sensor of the present embodiment may be completed. Since the above-mentioned portion has little connection with the point of the present embodiment, description thereof will be omitted.

As described before in detail, in the CMOS image sensor and the manufacturing method thereof of the present embodiments, the gates of the transistors may be formed in the active region of the unit pixel, and a diffusion region for the photo diode is defined by an ion implantation of impurities to the semiconductor substrate. Herein, the patterns of the photoresist that are the masking layer against ion implantation may be formed on the semiconductor substrate in such a manner that they may have the boundary portion of the isolation layer so as not to make the boundary of the defined photo diode contact with the boundary of the isolation layer. Then, impurities for the diffusion region of the photo diode may be ion-implanted to the active region for the photo diode.

Accordingly, the present embodiments have advantages in that damages by an ion implantation of impurities at the boundary portion between the diffusion region for the photo diode and the isolation layer may be prevented, which may reduce dark current of the COMS image sensor.

Also, by the present embodiment, the opening of the photoresist may be formed smaller than that of the existing photoresist, so that the CMOS image sensor may be manufactured while maintaining the existing manufacturing process the way it is without complicating the same.

Although embodiments consistent with the present invention have been described for illustrative purposes, those skilled in the art will appreciate that various modifications, additions and substitutions are possible, without departing from the scope and spirit of the invention as disclosed in the accompanying claims.

What is claimed is:

1. A method for manufacturing a CMOS image sensor, comprising:
   forming an isolation layer and an active region for a unit pixel on a semiconductor substrate;
   forming a transistor on said semiconductor substrate;
   forming a masking layer against an ion implantation on the isolation layer and on a portion of the active region on a boundary between the isolation layer and the active region; and
   forming an impurity diffusion region for a photo diode formed in a portion of the active region and separated from an isolation region by performing an ion implantation of impurities, wherein forming the impurity diffusion region for a photo diode comprises:
   forming an n⁻ type diffusion region in the active region; and
   forming a P⁰ type diffusion region on the n⁻ type diffusion region, wherein a non-diffusion region, where impurities are not diffused, is formed between the isolation region and both the n⁻ type diffusion region and the $P^0$ type diffusion region of the impurity diffusion region, the non-diffusion region being formed on at least two sides of the impurity diffusion region.

2. The method for manufacturing a CMOS image sensor according to claim 1, wherein said masking layer against ion implantation is formed with a photoresist.

3. The method for manufacturing a CMOS image sensor according to claim 1, wherein said semiconductor substrate is formed with a $P^{++}$ type silicon substrate having a $P^-$ type epitaxial layer.

4. The method for manufacturing a CMOS image sensor according to claim 1, wherein the $P^0$ type diffusion region is formed to reduce dark current generated on a surface of said semiconductor substrate.

* * * * *